United States Patent
Lu et al.

(10) Patent No.: US 10,297,573 B2
(45) Date of Patent: May 21, 2019

(54) THREE-DIMENSIONAL PACKAGE STRUCTURE AND THE METHOD TO FABRICATE THEREOF

(71) Applicant: CYNTEC CO., LTD., Hsinchu (TW)

(72) Inventors: Bau-Ru Lu, Changhua County (TW); Ming-Chia Wu, Hsinchu (TW); Shao Wei Lu, Hsinchu County (TW)

(73) Assignee: CYNTEC CO., LTD., Hsinchu (TW)

( * ) Notice: Subject to any disclaimer, the term of this patent is extended or adjusted under 35 U.S.C. 154(b) by 14 days.

(21) Appl. No.: 15/876,222

(22) Filed: Jan. 22, 2018

(65) Prior Publication Data

US 2018/0145050 A1    May 24, 2018

Related U.S. Application Data

(63) Continuation of application No. 14/492,085, filed on Sep. 22, 2014, now Pat. No. 9,911,715.

(51) Int. Cl.
*H01L 21/311* (2006.01)
*H01L 25/065* (2006.01)
*H01L 25/00* (2006.01)
*H01L 23/552* (2006.01)
*H05K 5/02* (2006.01)
(Continued)

(52) U.S. Cl.
CPC .......... *H01L 25/0655* (2013.01); *H01L 23/13* (2013.01); *H01L 23/3121* (2013.01); *H01L 23/36* (2013.01); *H01L 23/3735* (2013.01); *H01L 23/4006* (2013.01); *H01L 23/49811* (2013.01); *H01L 23/5389* (2013.01); *H01L 23/552* (2013.01); *H01L 25/50* (2013.01); *H05K 1/115* (2013.01); *H05K 3/42* (2013.01);

*H05K 5/0247* (2013.01); *H05K 5/065* (2013.01); *H05K 7/02* (2013.01); *H05K 7/20509* (2013.01); *H01L 2224/45124* (2013.01); *H01L 2224/45147* (2013.01); *H01L 2224/48091* (2013.01); *H01L 2224/48137* (2013.01);
(Continued)

(58) Field of Classification Search
CPC . H01L 25/0655; H01L 23/3121; H01L 23/13; H01L 23/36; H01L 23/3735; H01L 23/5389; H01L 23/49811; H01L 23/4006; H05K 7/20509; H05K 5/0247; H05K 5/065; H05K 1/115
USPC ....... 438/303, 591, 618, 421, 584, 637, 783, 438/763; 257/774, 522, 419, 773, 758, 257/737, 499, 762, 764, 506
See application file for complete search history.

(56) References Cited

U.S. PATENT DOCUMENTS

| | | | |
|---|---|---|---|
| 2007/0057284 A1* | 3/2007 | Casey | H01L 23/3675 257/177 |
| 2009/0115042 A1* | 5/2009 | Koyanagi | H01L 21/561 257/686 |
| 2012/0103588 A1* | 5/2012 | Kim | H05K 1/053 165/185 |

* cited by examiner

*Primary Examiner* — Moin M Rahman
(74) *Attorney, Agent, or Firm* — Min-Lee Teng; Litron Patent & Trademark Office

(57) ABSTRACT

A three-dimensional package structure, comprising: a substrate; a first plurality of discrete electronic components disposed over the bottom surface of the substrate, wherein a first insulating layer is disposed over the bottom surface of the substrate to encapsulate the first plurality of discrete electronic components, wherein at least one second insulating layer is disposed over the first insulating layer, wherein a plurality of surface-mount pads are disposed on the bottom surface of the at least one second insulating layer and
(Continued)

electrically connected to at least one via disposed in the at least one second insulating layer.

18 Claims, 17 Drawing Sheets

Related U.S. Application Data

(60) Provisional application No. 61/918,684, filed on Dec. 20, 2013.

(51) Int. Cl.
*H05K 5/06* (2006.01)
*H05K 1/11* (2006.01)
*H05K 3/42* (2006.01)
*H05K 7/02* (2006.01)
*H05K 7/20* (2006.01)
*H01L 23/13* (2006.01)
*H01L 23/36* (2006.01)
*H01L 23/373* (2006.01)
*H01L 23/40* (2006.01)
*H01L 23/498* (2006.01)
*H01L 23/538* (2006.01)
*H01L 23/31* (2006.01)

(52) U.S. Cl.
CPC .............. *H01L 2924/13055* (2013.01); *Y10T 29/49117* (2015.01); *Y10T 29/49155* (2015.01); *Y10T 29/49165* (2015.01)

THREE-DIMENSIONAL PACKAGE STRUCTURE AND THE METHOD TO FABRICATE THEREOF

CROSS-REFERENCES TO RELATED APPLICATIONS

This application is a continuation of U.S. patent application Ser. No. 14/492,085, filed on Sep. 22, 2014, which claims the benefit of U.S. Provisional Patent Application No. 61/918,684 filed on Dec. 20, 2013, each of which is hereby incorporated by reference and made a part of specification.

BACKGROUND OF THE INVENTION

I. Field of the Invention

The present invention relates to a package structure, and in particular, to a three-dimensional package structure.

II. Description of the Prior Art

Electronic package structures are formed by complicated package processes. Different electronic package structures have different electrical performance and capacities of heat dissipation, and therefore an electronic package structure with a desired electrical performance and capacity of heat dissipation can be selected according to a design requirement.

FIG. 1 illustrates a schematic cross-sectional view of a conventional electronic package structure 10. Referring to FIG. 1, the electronic elements 12 (e.g., SBD or IGBT) are disposed on a top surface of the PCB (printed circuit board) 11 through the soldering pads 15 and electrically connected to the PCB 11. A first copper metallization sheet 16 can be disposed between the electronic elements 12 and the top surface of the PCB 11. Wire-bond 17 is applied for electrical interconnection. An encapsulating material 14 encapsulates the electronic elements 12. For external electrical connection, the assembly pins (e.g., busbar connection) 18 are exposed outside the encapsulating material 14 in the form of DIP type. A housing 19 can cover the encapsulating material 14. A second copper metallization 21, a substrate attach material 22, a baseplate 23, a thermal grease 24 and a heat sink 25 can be disposed on the bottom surface of the PCB (e.g., for better heat dissipation). It's one of the main package processes in the industry due to its easiness, maturity, better reliability.

However, conventional electronic package structure has many disadvantages. For example, if pins in a design are changed, development work of a new molding device is needed, and therefore a single molding device can't be fitted into all products. Furthermore, the size of the conventional electronic package structure is bigger due to wire-bond height and knife-retracting distance is needed in design. Accordingly, the present invention proposes a three-dimensional package structure to overcome the above-mentioned disadvantages.

SUMMARY OF THE INVENTION

One objective of the present invention is to provide a three-dimensional package structure to achieve a high utilization of an internal space of the three-dimensional package structure so that the size of electronic package structure can be reduced. The three-dimensional package structure comprises: a substrate having a top surface and a bottom surface; a first plurality of discrete conductive components disposed over the bottom surface of the substrate; and a connecting structure disposed over the bottom surface of the substrate for encapsulating the first plurality of discrete electronic components, wherein the connecting structure comprises at least one insulating layer and a plurality of conductive patterns separated by the at least one insulating layer, wherein the plurality of conductive patterns are disposed over the first plurality of discrete electronic components for electrically connecting the first plurality of discrete electronic components.

A portion of the first plurality of conductive patterns electrically connects at least two of the first plurality of discrete electronic components. An insulating layer is disposed on the substrate so as to form a substantially horizontal surface over the discrete first electronic components, wherein the first plurality of conductive patterns are disposed over the substantially horizontal surface. In one embodiment, at least one terminal of the first plurality of discrete electronic components is disposed on the substantially horizontal surface. In another embodiment, all terminals of the first plurality of discrete electronic components are disposed on the substantially horizontal surface.

In one embodiment of the present invention, the top surface of the substrate comprises a cavity, wherein at least one of the first plurality of discrete conductive components is disposed in the cavity.

In one embodiment of the present invention, the three-dimensional package further comprises another conductive component disposed aside the substrate.

In one embodiment of the present invention, the substrate is a heat-dissipating substrate.

In one embodiment of the present invention, the conductive patterns are disposed over the first plurality of discrete conductive components to thermally connect the first plurality of discrete conductive components such that heat generated by the first plurality of discrete conductive components is dissipated to the outside of the three-dimensional package structure through the plurality of conductive patterns.

Another objective of the present invention is to provide a multiple-substrate three-dimensional package structure comprising at least two package structures. In one embodiment, the multiple-substrate three-dimensional package structure comprises a first package structure and a second package structure disposed on the first package structure. The first package structure can be a three-dimensional package structure previously described. A second package structure can be any suitable package structure. The first package structure can be bonded to the second package structure by soldering or dispensing.

Another objective of the present invention is to provide a method for forming a three-dimensional package structure. The method comprises the steps of: (a) providing a substrate having a top surface and a bottom surface; (b) disposing a first plurality of discrete conductive components over the bottom surface of the substrate; and (c) disposing a connecting structure over the bottom surface of the substrate for encapsulating the first plurality of discrete electronic components, wherein the connecting structure comprises at least one insulating layer and a plurality of conductive patterns separated by the at least one insulating layer, wherein the plurality of conductive patterns are disposed over the first plurality of discrete electronic components for electrically connecting the first plurality of discrete electronic components.

The detailed technology and above-preferred embodiments implemented for the present invention are described in the following paragraphs accompanying the appended drawings for people skilled in this field to well appreciate the features of the claimed invention.

BRIEF DESCRIPTION OF THE DRAWINGS

The foregoing aspects and many of the accompanying advantages of this invention will become more readily appreciated as the same becomes better understood by reference to the following detailed description when taken in conjunction with the accompanying drawings, wherein.

DETAILED DESCRIPTION OF THE INVENTION

The detailed explanation of the present invention is described as follows. The described preferred embodiments are presented for purposes of illustrations and description and they are not intended to limit the scope of the present invention.

The following embodiments disclose a three-dimensional packaging structure and a method for manufacturing the three-dimensional packaging structure. The three-dimensional package structure has a relatively high utilization of the internal space thereof so that the size of electronic package structure can be reduced. A three-dimensional packaging structure means a packaging structure on which the conductive elements are constructed not only in plane but also stacked in height to improve the spatial efficiency.

Figure 1:
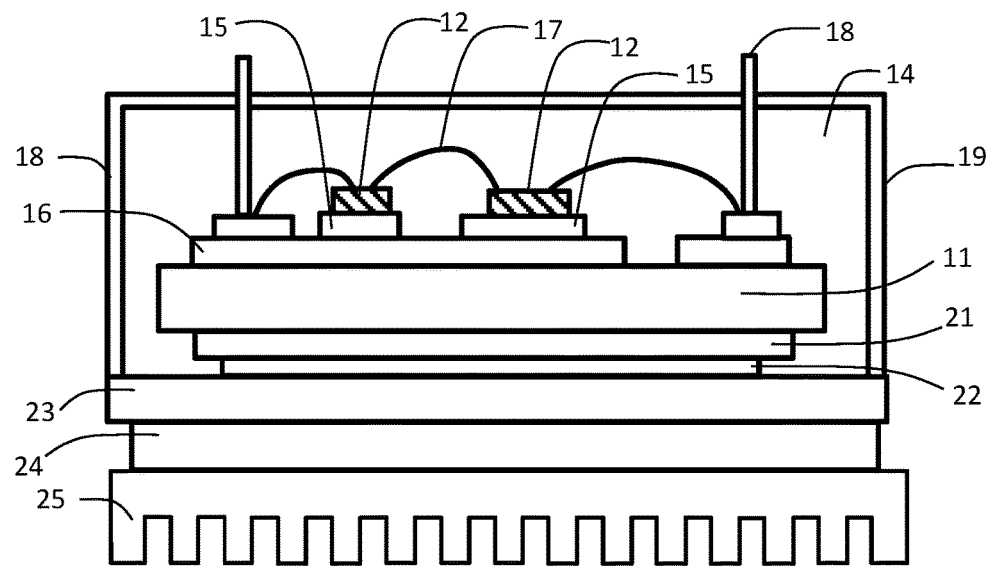
FIG. 1 illustrates a schematic cross-sectional view of a conventional electronic package structure.
Figure 2A:
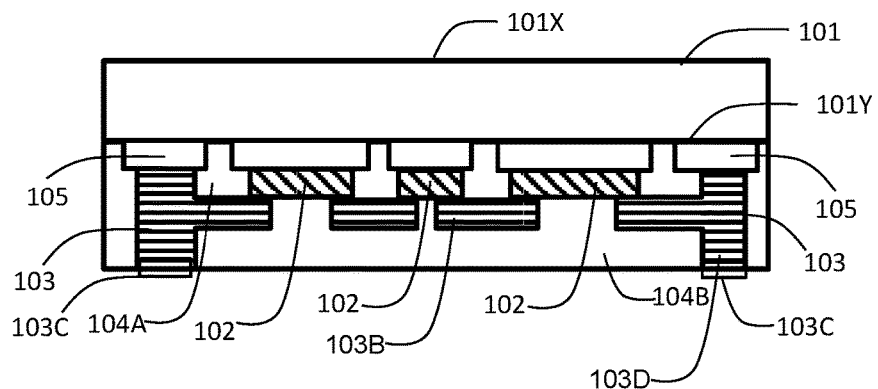
FIG. 2A illustrates a schematic cross-sectional view of the three-dimensional package structure in accordance with the present invention.
Figure 2B:
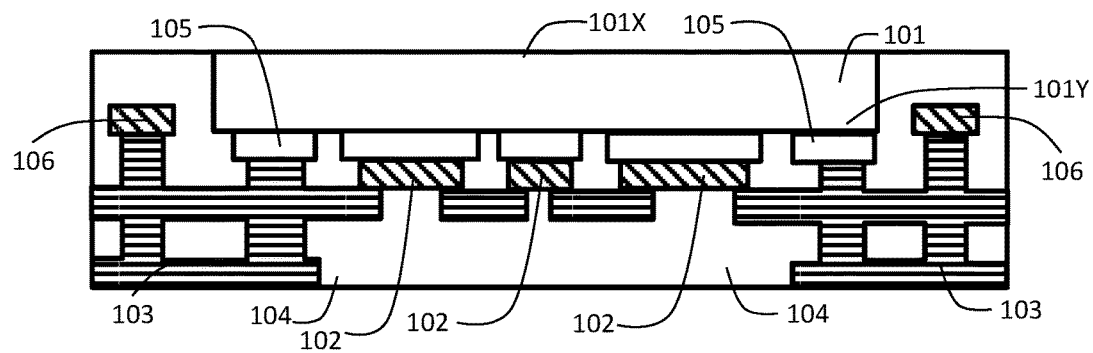
FIG. 2B illustrates a schematic cross-sectional view of the three-dimensional package structure where a second conductive component is disposed aside the substrate in accordance with the present invention.

FIG. 2A illustrates a schematic cross-sectional view of the three-dimensional package structure 100 in accordance with the present invention. The three-dimensional package structure 100 is generally applied to a voltage regulator module, a power module, a network adapter, a graphics processing unit, a DC/DC converter or a point-of-load (POL) converter. The three-dimensional package structure 100 includes a substrate 101, a first plurality of discrete conductive components 102, a connecting structure 103, 104A, 104B. The connecting structure 103, 104A, 104B includes a plurality of conductive patterns 103 and a first insulating layer 104A and at least one second insulating layer 104B. The substrate 101 has a top surface 101X and a bottom surface 101Y. A first plurality of discrete conductive components 102 (e.g., IC chip, MOSFET, IGBT, diode, resistor, inductor, choke or capacitor, preferably IGBT) are disposed over the bottom surface 101Y of the substrate 101. The connecting structure 103, 104A, 104B is disposed over the bottom surface 101Y of the substrate 101 for encapsulating the first plurality of discrete electronic components 102, or the first insulating layer 104A is disposed over the bottom surface 101Y of the substrate 101 to encapsulate the first plurality of discrete electronic components 102. The connecting structure 103, 104A, 104B comprises a plurality of conductive patterns 103 separated by the first insulating layer 104A and the at least one second insulating layer 104B. The plurality of conductive patterns 103 are disposed over the first plurality of discrete electronic components 102 for electrically connecting the first plurality of discrete electronic components 102, wherein a first conductive pattern 103B of the plurality of conductive patterns 103 is disposed on and in contact with a top surface of the first insulating layer 104A, wherein the top surface of the first insulating layer 104A has a horizontal surface. Optionally, a second conductive component 106 (e.g., IC chip, MOSFET, IGBT, diode, resistor, inductor, choke or capacitor) can be disposed aside the substrate 101 (See FIG. 2B). Preferably, a bottom metallic sheet 105 (maybe a patterned metallic sheet), preferably made of Cu, is disposed between the first plurality of discrete conductive components 102 and the substrate 101 for circuit design and configuration of the first plurality of discrete conductive components 102. In one embodiment, at least two of the first plurality of discrete conductive components 102 are electrically connected through a portion of the conductive patterns 103. The conductive patterns 103 comprise a plurality of surface-mount pads 103C disposed on the bottom surface of the connecting structure 103, 104A, 104B of the reversed three-dimensional package structure 100 for connecting an external circuit, or the plurality of surface-mount pads 103C are disposed on the bottom surface of the at least one second insulating layer 104B, wherein the plurality of surface-mount pads 103C are connected to at least one via 103D disposed in the at least one second insulating layer 104B.

Figure 2C:
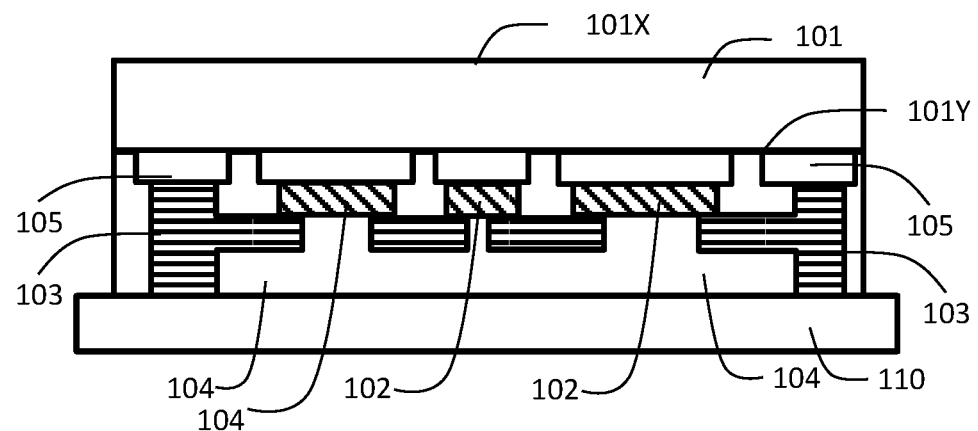
FIG. 2C illustrates a schematic cross-sectional view of the three-dimensional package structure bonded to a circuit substrate in accordance with the present invention.

FIG. 2C illustrates a schematic cross-sectional view of the three-dimensional package structure 100 bonded to a circuit substrate 110 in accordance with the present invention. After forming the conductive patterns 103 over the first plurality of discrete conductive components 102 by any suitable patterning process (e.g., lithography process), reverse the three-dimensional package structure 100 and bond the three-dimensional package structure 100 to a circuit substrate 110 (e.g., printed circuit board) (not shown) through the conductive patterns 103 (e.g., SMT). The stacking order from top to bottom is "the substrate 101, the first plurality of discrete conductive components 102, the conductive patterns 103, and the circuit substrate 110". The conductive patterns 103 can comprise at least one pad (not shown) disposed on the bottom surface of the connecting structure 103, 104 of the reversed three-dimensional package structure 100 for connecting an external circuit. The conductive patterns 103 connects at least one terminal of the discrete first electronic components 102 to a pad on the bottom surface of the connecting structure 103, 104 of the reversed three-dimensional package structure 100 for connecting to an external circuit, such as a circuit substrate. In other words, the conductive patterns 103 connecting terminals of the first plurality of discrete conductive components 102 to the top surface of the non-reversed three-dimensional package structure 100 for bonding to the circuit substrate 110. One or more terminals of each of the first plurality of discrete conductive components 102 can be disposed on the bottom surface of the corresponding reversed first conductive component 102. In other words, at least a portion of the terminals of each of the first plurality of discrete conductive components 102 faces the circuit substrate 110. Preferably, terminals of each of the discrete first conductive component 102 face the circuit substrate 110 and are electrically connected to the circuit substrate 110 through the conductive patterns 103.

An insulating layer 104 is disposed on the substrate 101 so as to form a substantially horizontal surface over the discrete electronic components 102, wherein the conductive patterns 103 are disposed over the horizontal surface. In one embodiment, at least one terminal of the discrete first electronic components 102 is disposed on the horizontal surface. In another embodiment, all terminals of the discrete electronic components 102 are disposed on the horizontal surface.

Figure 2D:
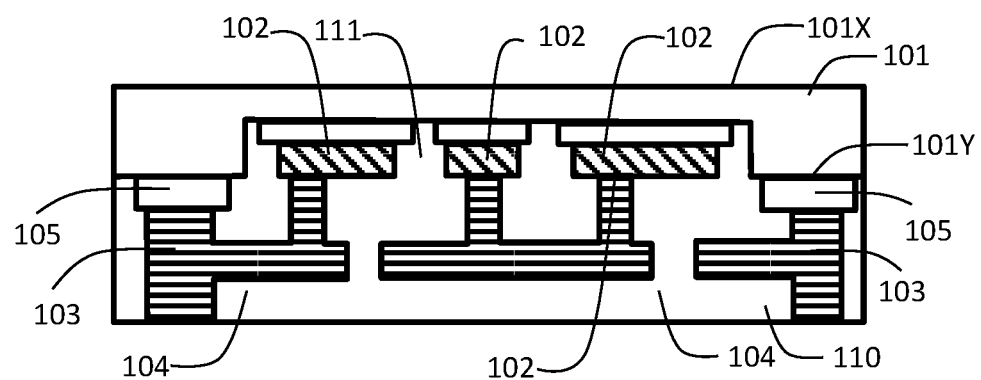
FIG. 2D illustrates a schematic cross-sectional view of the three-dimensional package structure having a cavity in the substrate in accordance with the present invention.

FIG. 2D illustrates a schematic cross-sectional view of the three-dimensional package structure 100 having a cavity 111 in the substrate 101 in accordance with the present invention. The substrate 101 may comprise a cavity 111 therein, and the first plurality of discrete conductive components 102 can be disposed in the cavity 111 to further decrease the height of the three-dimensional package structure 100. There are many different ways to locate the cavity 111: in one embodiment, the cavity 111 is formed inside the substrate 101; in another embodiment, the cavity 111 is formed with one side aligned with one edge of the substrate 101; in yet another embodiment, the cavity 111 is formed with two sides aligned with two edges of the substrate 101 respectively.

The substrate 101 has an exposed top surface 101X, so heat generated by the first plurality of discrete conductive components 102 can be dissipated to the outside of the three-dimensional package structure 100 via the heat-dissipating substrate 101. Besides, the conductive patterns 103 can also be thermally connected to the first plurality of discrete conductive components 102 such that heat generated by the first plurality of discrete conductive components 102 is dissipated to the outside of the three-dimensional package structure 100 through the conductive patterns 103. Accordingly, the three-dimensional package structure 100 has a double-surface dissipating function due to the heat dissipating substrate 101.

Figure 3A:
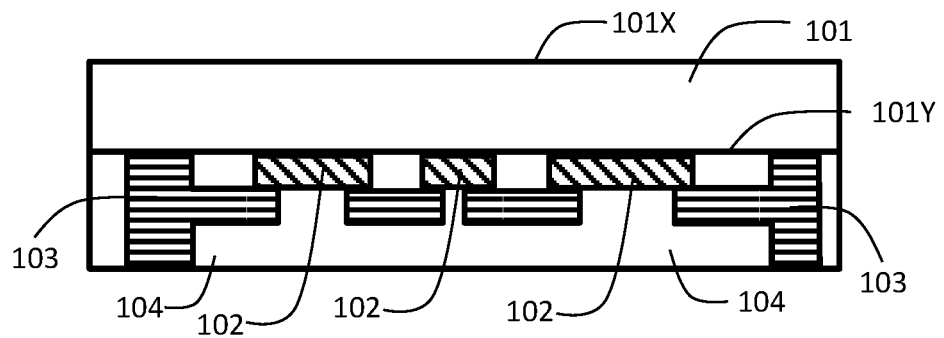
FIG. 3A illustrates a schematic cross-sectional view of the three-dimensional package structure where the substrate is a unitary body made of an insulating and heat-conducting material in accordance with the present invention.
Figure 3B:
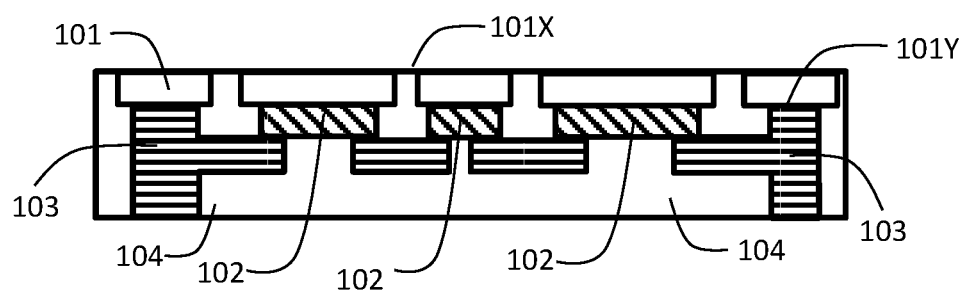
FIG. 3B illustrates a schematic cross-sectional view of the three-dimensional package structure where the substrate is a unitary metallic sheet made of a high electrically-conducting and high heat-conducting material in accordance with the present invention.

The substrate 101 can be a ceramic substrate, a PCB, a metallic substrate, a lead frame, and so on. The substrate 101 can include any suitable insulating and heat-conducting material, such as AlN, ceramic, graphene, epoxy, or the like. The bottom metallic sheet 105 (e.g., circuit patterned layer) can include any suitable high electrically-conducting and heat-conducting material, such as graphene, Cu, Au, Ag, Al, or the like. In one embodiment, the substrate 101 can be a unitary body made of an insulating and heat-conducting material, such as AlN, ceramic, graphene or epoxy, so no metallic sheet is needed on the top surface 101X and the bottom surface 101Y of the substrate 101 for heat dissipation (See FIG. 3A). In one embodiment, the substrate 101 can be a unitary metallic sheet (e.g., circuit patterned layer) made of a high electrically-conducting and high heat-conducting material, such as graphene, Cu, Au, Ag or Al, so no insulating and heat-conducting material is needed for heat dissipation (See FIG. 3B).

Figure 3C:
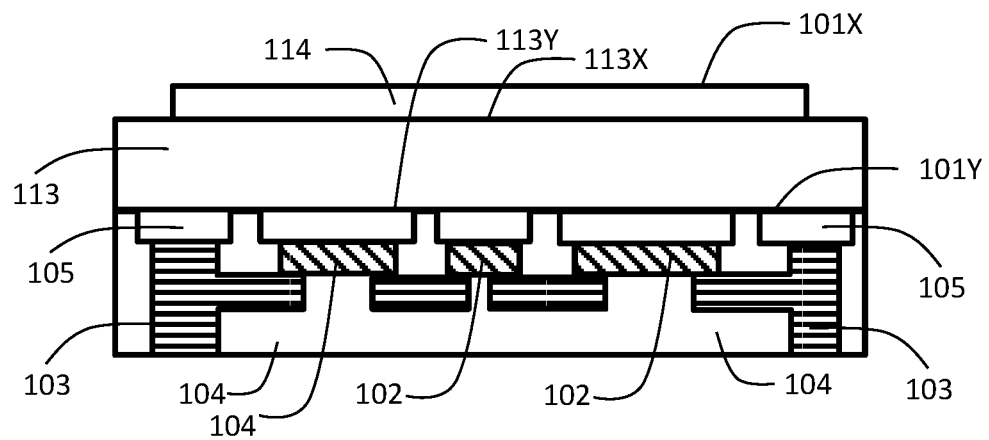
FIG. 3C illustrates a schematic cross-sectional view of the three-dimensional package structure where the substrate is a combination of a carrier and a top metallic sheet in accordance with the present invention.
Figure 3D:
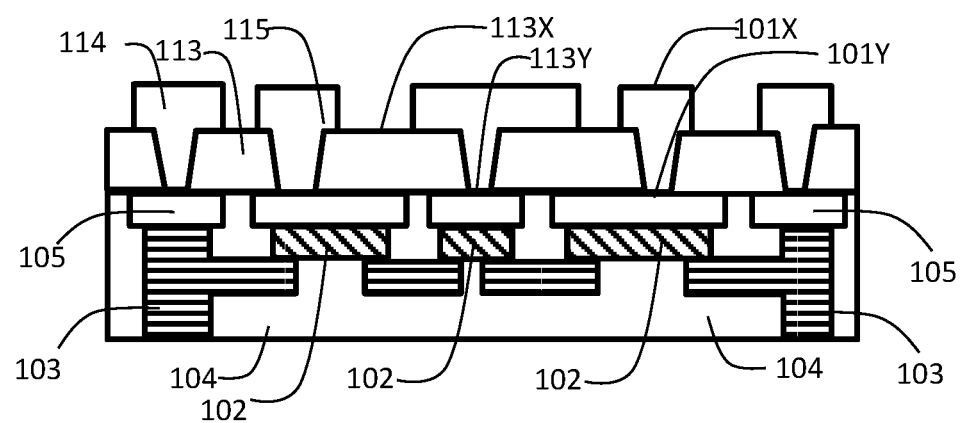
FIG. 3D illustrates a schematic cross-sectional view of the three-dimensional package structure where the substrate has a plurality of via patterns connecting the top metallic sheet to the first plurality of discrete conductive components in accordance with the present invention.

The substrate 101 can be a composite substrate. In one embodiment, the substrate 101 can be a combination of a carrier 113 and a top metallic sheet 114 (maybe a patterned metallic sheet), preferably made of Cu; a carrier 113 has a first surface 113Y and a second surface 113X opposite to the first surface 113Y, the first plurality of discrete conductive components 102 are disposed over the first surface 113Y of the carrier 113; and the top metallic sheet 114 is disposed on the second surface 113X of the carrier 113 (See FIG. 3C). Preferably, a bottom metallic sheet 105 (maybe a patterned metallic sheet), preferably made of Cu, is disposed between the first plurality of discrete conductive components 102 and the carrier 113 for circuit design and configuration of the first plurality of discrete conductive components 102. The carrier 113 can be a ceramic substrate, a PCB, a metallic substrate, a lead frame, and so on. The carrier 113 can include any suitable insulating and heat-conducting material, such as AlN, ceramic, graphene, epoxy, or the like. The top metallic sheet 114 can include any suitable high electrically-conducting and heat-conducting material, such as graphene, Cu, Au, Ag, Al, or the like. The carrier 101 can have a plurality of via patterns 115 connecting the top metallic sheet 114 to the first plurality of discrete conductive components 102 (or the bottom metallic sheet 105) to improve better dissipation performance (See FIG. 3D).

The conductive patterns 103 can be formed by thin film technology, such as photolithography, sputtering, electroplating or chemical vapor deposition process. The conductive patterns 103 can be also disposed as multiple layers for different functions. For example, the conductive patterns 103 include a plurality of via-layers and wire layers.

At least one insulating layer 104 (e.g., ABF (Ajinomoto Build-up Film)) encapsulates the first plurality of discrete conductive components 102. In one embodiment, ABF (Ajinomoto Build-up Film) is attached to the bottom surface 101Y of the substrate 101 by pressing onto the bottom surface 101Y of the substrate 101 for encapsulating the discrete first electronic components 102. Please note that other insulating materials can be used instead of the ABF (Ajinomoto Build-up Film), and different layers may contain different insulating materials. In one embodiment, an EMC (Epoxy Molding Compound) layer is disposed on the bottom surface 101Y of the substrate 101, wherein the discrete first electronic components 102 and some conductive patterns can be disposed on the EMC layer, wherein the connecting structure 103,104 can be disposed on the EMC (Epoxy Molding Compound) layer to encapsulate the discrete first electronic components 102 and said some conductive patterns, wherein said some conductive patterns can be electrically connected to the conductive patterns 103 in the connecting structure 103,104.

Figure 4A:
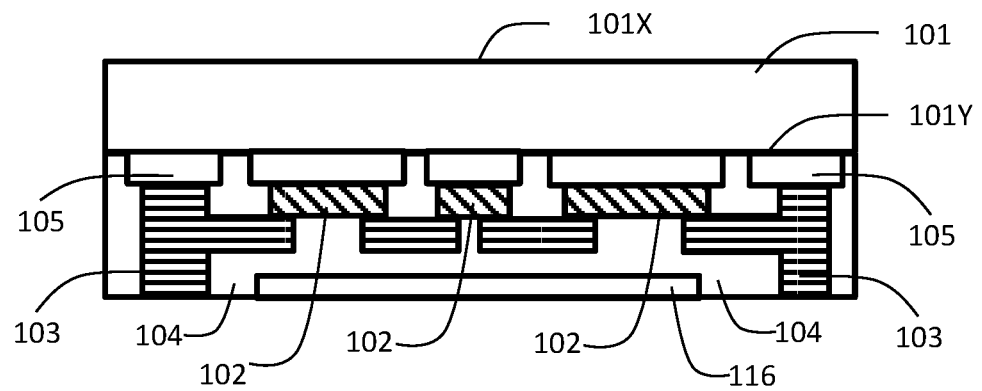
FIG. 4A illustrates a schematic cross-sectional view of the three-dimensional package structure where the conductive patterns comprise a shielding layer disposed over the first plurality of discrete conductive components in accordance with the present invention.
Figure 4B:
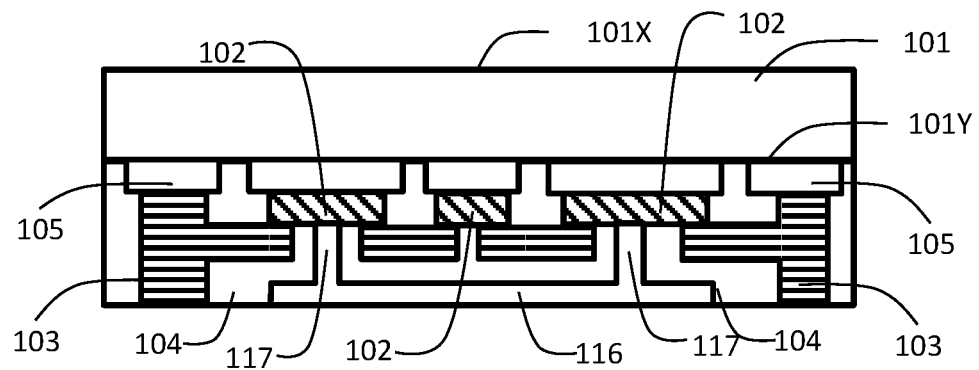
FIG. 4B illustrates a schematic cross-sectional view of the three-dimensional package structure where the via patterns are disposed between the shielding layer and discrete first conductive components in accordance with the present invention.

In a conventional package structure, a shielding layer can not be formed over the conductive elements by wire-bonding. In the present invention, the conductive patterns 103 comprise a shielding layer 116 disposed over the first plurality of discrete conductive components 102 (i.e. global shielding) (see FIG. 4A). The via patterns 117 can be disposed between the shielding layer 116 and the first plurality of discrete conductive components 102 (i.e. local shielding) (see FIG. 4B).

Figure 5:
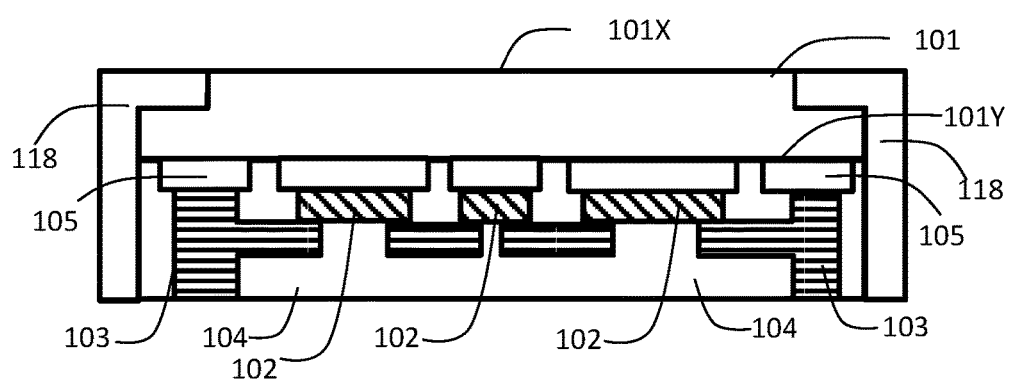
FIG. 5 illustrates a schematic cross-sectional view of the three-dimensional package structure where a housing is disposed around the periphery of the substrate in accordance with the present invention.

A housing 118 can be disposed around the periphery of the substrate 101 to expose a portion of the top surface 101X of the substrate 101 and a portion of the conductive patterns 103 (See FIG. 5). The housing 118 can also function as shielding object to avoid external interference.

Figure 6A:
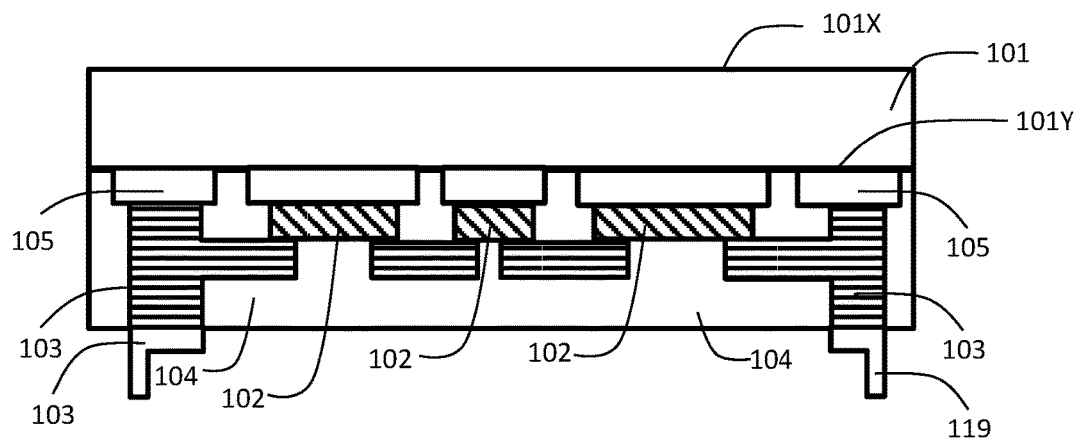
FIG. 6A illustrates a schematic cross-sectional view of the three-dimensional package structure where a plurality of pins are disposed on the conductive patterns in accordance with the present invention.
Figure 6B:
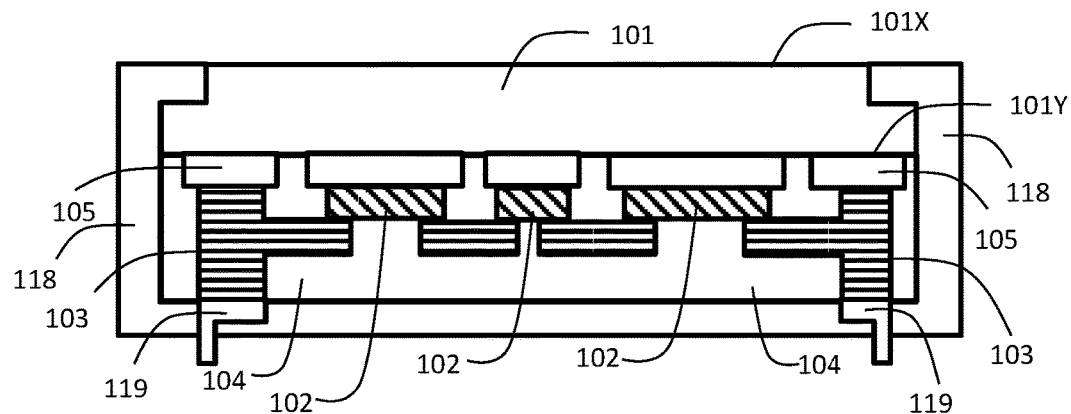
FIG. 6B illustrates a schematic cross-sectional view of the three-dimensional package structure where the housing is extended downward to the conductive patterns to expose the pins in accordance with the present invention.
Figure 6C:
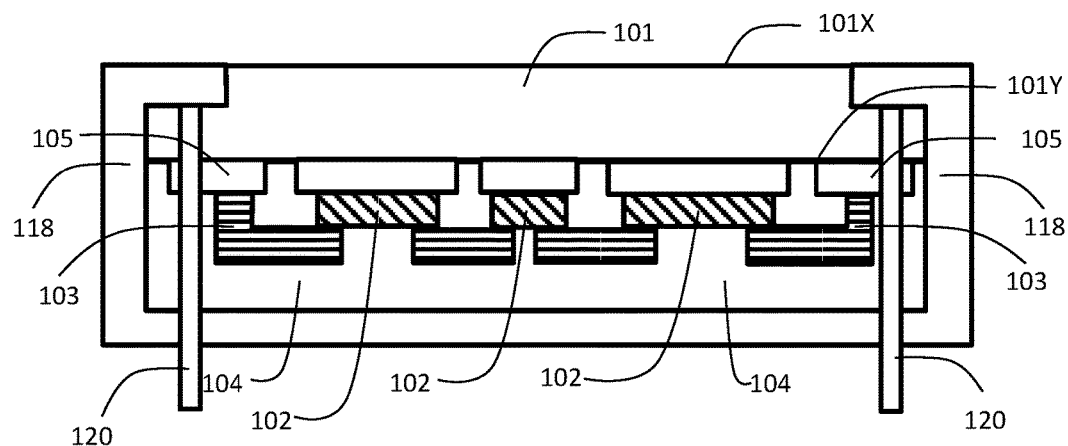
FIG. 6C illustrates a schematic cross-sectional view of the three-dimensional package structure where each pin is inserted in the corresponding recess or through-opening of the substrate in accordance with the present invention.
Figure 6D:
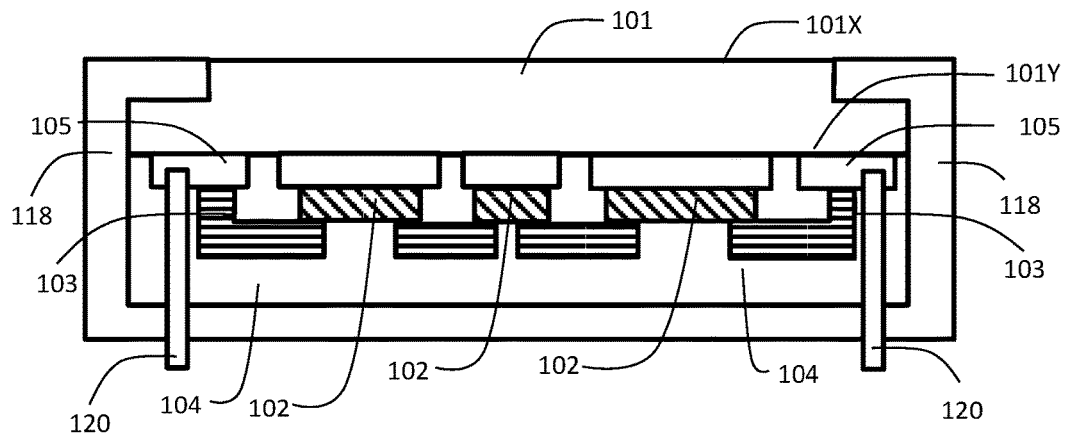
FIG. 6D illustrates a schematic cross-sectional view of the three-dimensional package structure where each pin is inserted in the corresponding recess or through-opening of the bottom metallic sheet in accordance with the present invention.

The three-dimensional package structure 100 can comprise a plurality of pins 119 disposed on the conductive patterns 103 to serve as the external connection ends thereof (See FIG. 6A). The housing 118 can be extended downward to the conductive patterns 103 to expose the pins 119 (See FIG. 6B). The pins 119 can be inserted in the housing 118 before they are soldered on the conductive patterns 103. The pins 119 can be also soldered through the lead frame or the alignments, and then decide whether the housing 118 is needed or not after semifinished products have been done. The three-dimensional package structure 100 can be bonded to a circuit substrate 110 (e.g., DIP). In one embodiment, the substrate 101 comprises a plurality of recesses or through-openings therein, wherein each of the pins 120 is inserted in the corresponding recess or through-opening (See FIG. 6C). In one embodiment, the bottom metallic sheet 105 comprises a plurality of recesses or through-openings therein, wherein each of the pins 120 is inserted in the corresponding recess or through-opening (See FIG. 6D).

Figure 7:
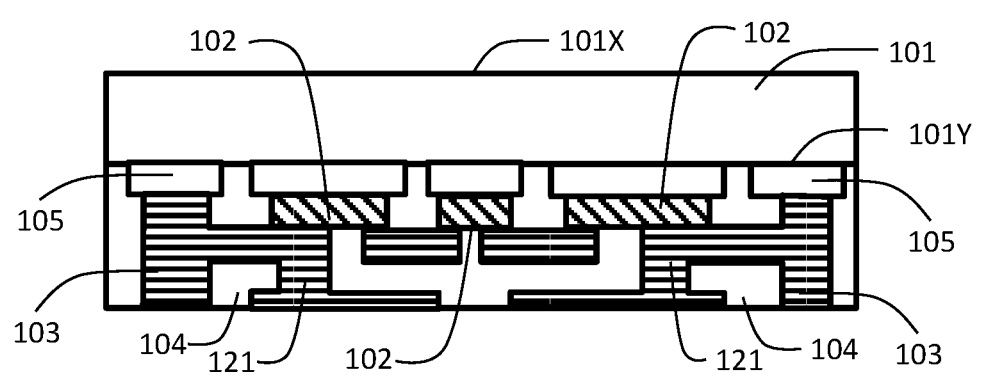
FIG. 7 illustrates a schematic cross-sectional view of the three-dimensional package structure where each of the via patterns of the conductive patterns is directly disposed on the corresponding first conductive component in accordance with the present invention.

The conductive patterns 103 can comprise a plurality of via patterns 121 each of which is directly disposed on a corresponding first conductive component 102 for quick electrically-conducting and heat-conducting, so dissipating power per unit area is larger and double-surface dissipating can be improved a lot (See FIG. 7).

Figure 8A:
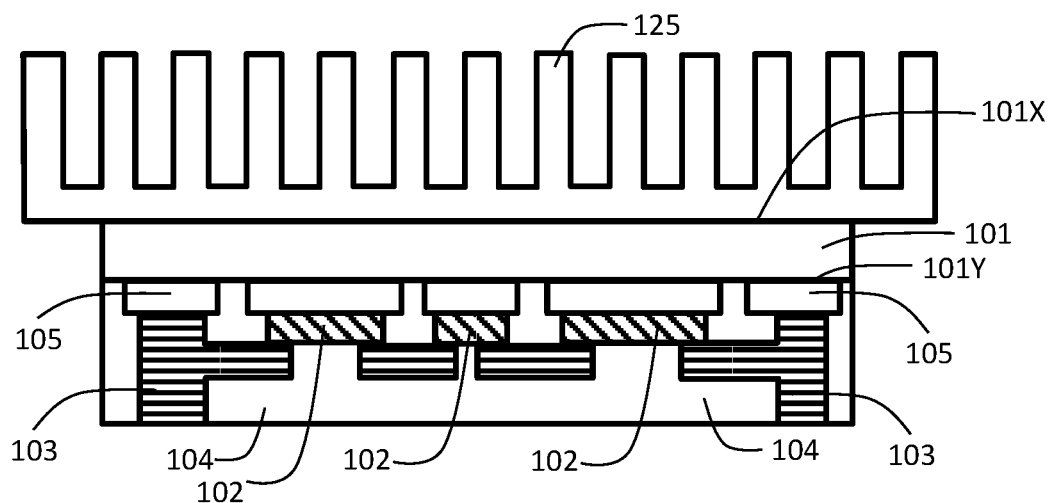
FIG. 8A illustrates a schematic cross-sectional view of the three-dimensional package structure where a first heat-sink can be disposed over the top surface of the substrate in accordance with the present invention.
Figure 8B:
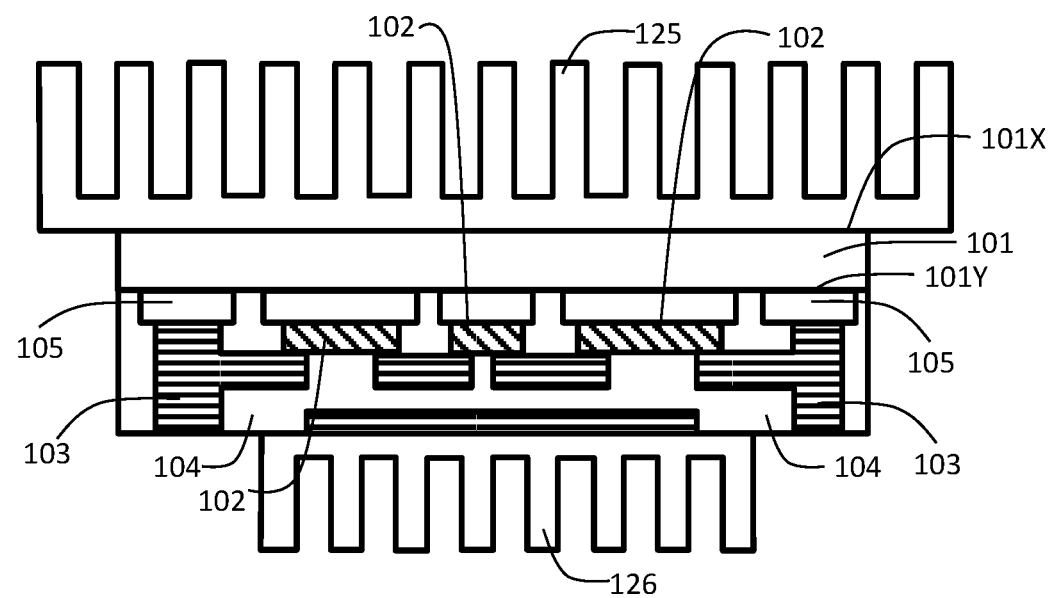
FIG. 8B illustrates a schematic cross-sectional view of the three-dimensional package structure where a second heat-sink is disposed over the plurality of conductive patterns in accordance with the present invention.
Figure 8C:
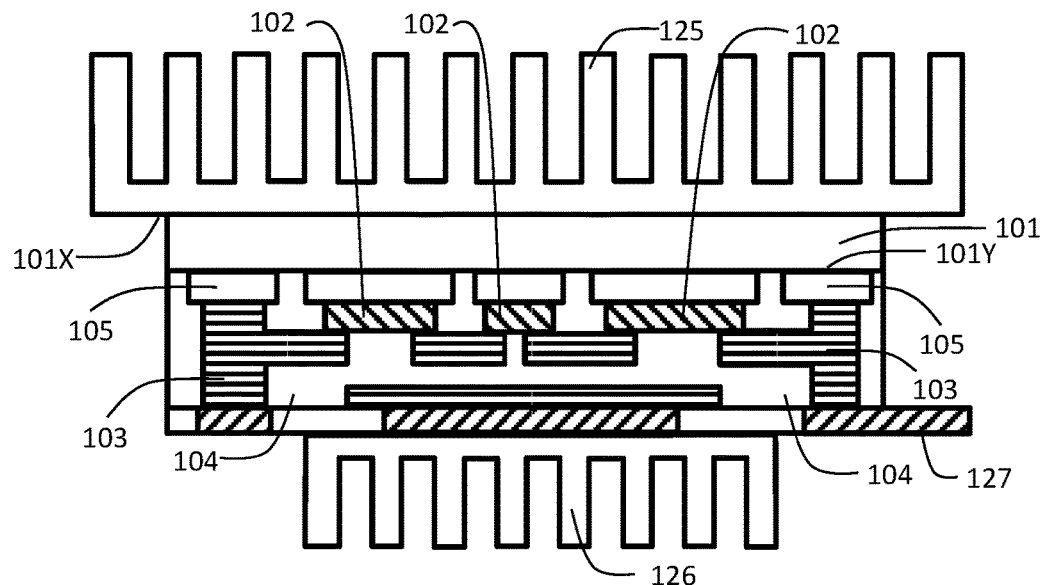
FIG. 8C to FIG. 8D illustrate a schematic cross-sectional view of the three-dimensional package structure where a lead frame can be disposed between the conductive patterns and the second heat-sink to form SIP, DIP or any other type of package structure in accordance with the present invention.
Figure 8D:
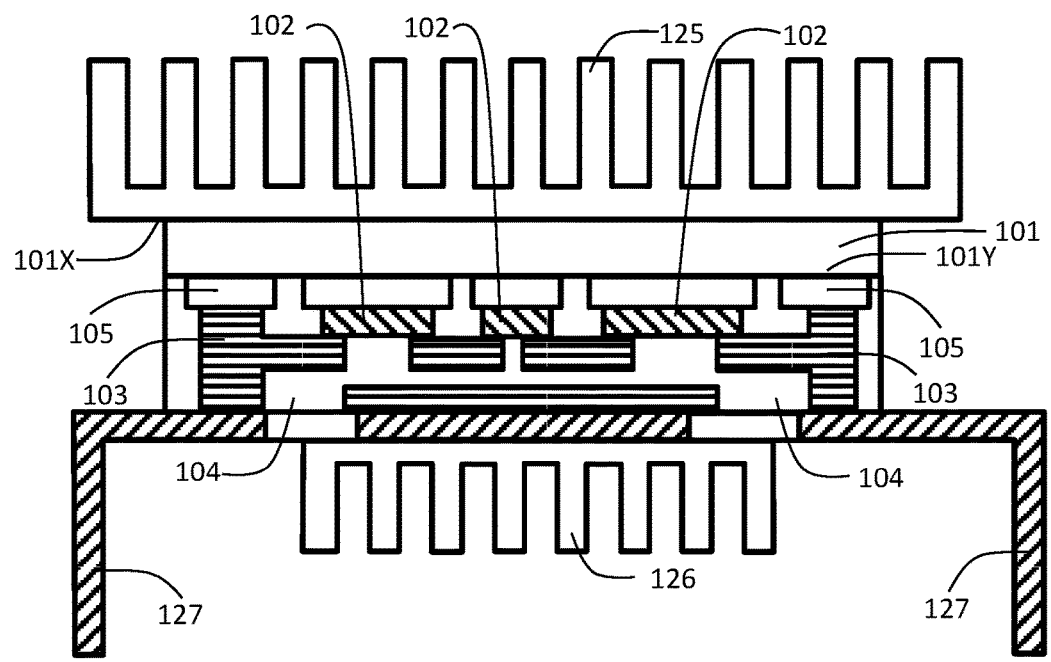
Figure 8E:
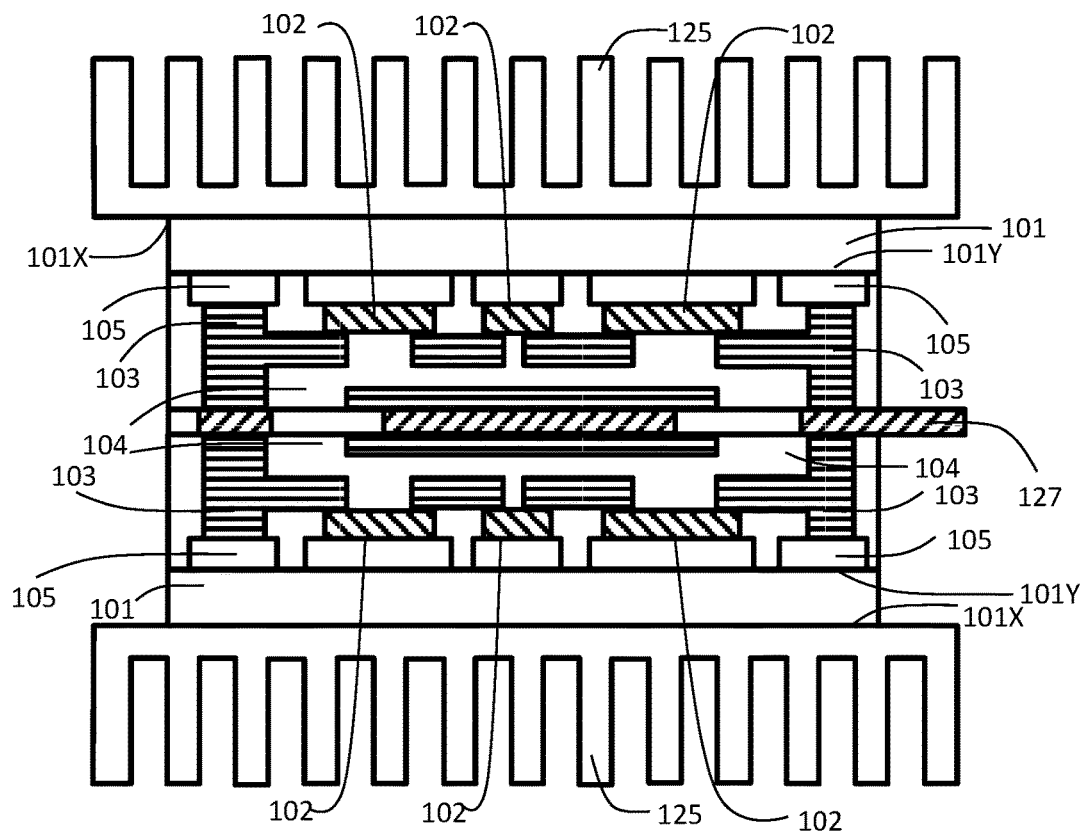
FIG. 8E to FIG. 8F illustrate a schematic cross-sectional view of the three-dimensional package structure where a lead frame can be disposed between the three-dimensional package structures previously described to form SIP, DIP or any other type of package structure in accordance with the present invention.
Figure 8F:
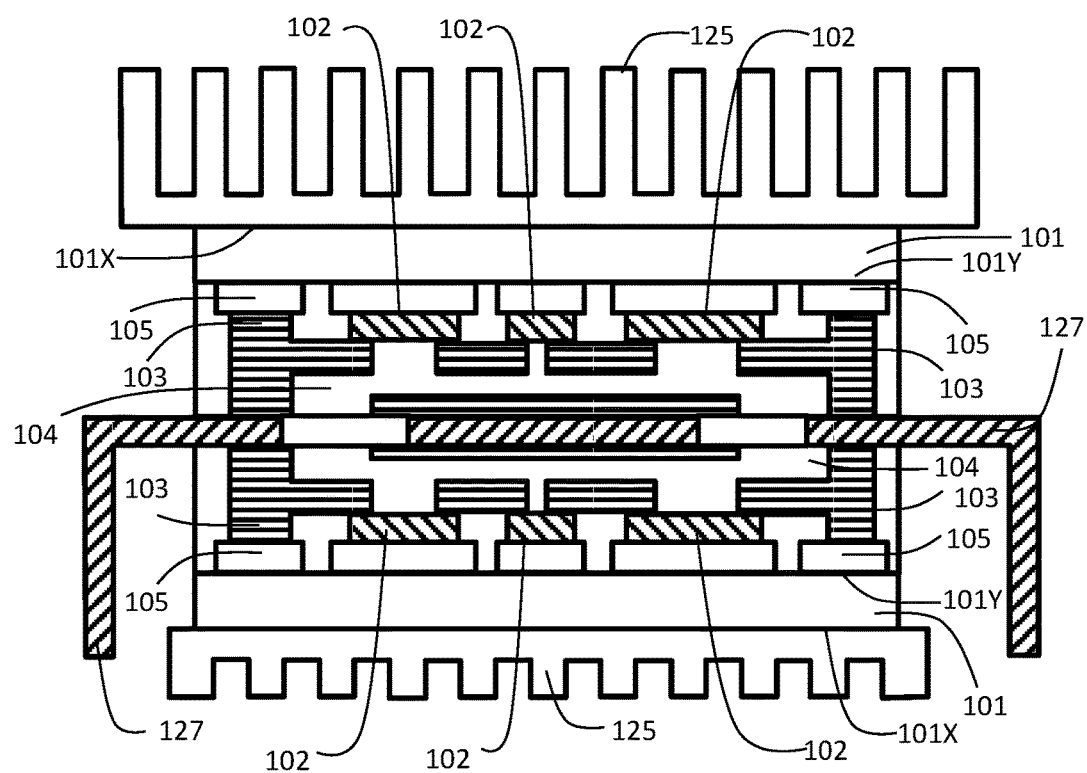

A first heat-sink 125 can be disposed over the top surface 101X of the substrate 101 for improving heat dissipating (See FIG. 8A). Screws can be used to fix the first heat-sink 125 through the round-holes formed in the housing 118. Besides, customers can use screws to fix the first heat-sink 125 through the through-holes formed in the substrate 101. To increase the insulating and pressure-enduring distance, insulating adhesive can be applied to the screws after using screws to fix the first heat-sink 125. In one embodiment, a second heat-sink 126 can be disposed over the plurality of conductive patterns 103 to improve double-surface dissipating a lot (See FIG. 8B). A lead frame 127 can be disposed between the conductive patterns 103 and the second heat-sink 126 to form SIP, DIP or any other type of package structure (See FIG. 8C to FIG. 8D). Moreover, a lead frame 127 can be disposed between the three-dimensional package structures 100 previously described to form SIP, DIP or any other type of package structure (See FIG. 8E to FIG. 8F).

The present invention also discloses a multiple-substrate three-dimensional package structure 200 having many advantages including: a. the design area of PCB can be shrunk; b. module circuit can be divided into a plurality of sub-circuits respectively designed in a plurality of substrates; c. circuit patterns can be formed on the opposite surfaces of the substrate or in the through-vias of the substrate; d. electrical performance of the semifinished products can be first tested after they have been done; if passed, the circuit substrates can be stacked and assembled to raise product yield and reduce the number of the circuit-patterning process. The multiple-substrate three-dimensional package structure 200 comprises at least two package structures. In one embodiment, the multiple-substrate three-dimensional package structure 200 comprises a first package structure and a second package structure disposed on the first package structure. The first package structure can be a three-dimensional package structure 100 previously described. A second package structure can be any suitable package structure. The first package structure can be bonded to the second package structure by soldering or dispensing.

Figure 9A:
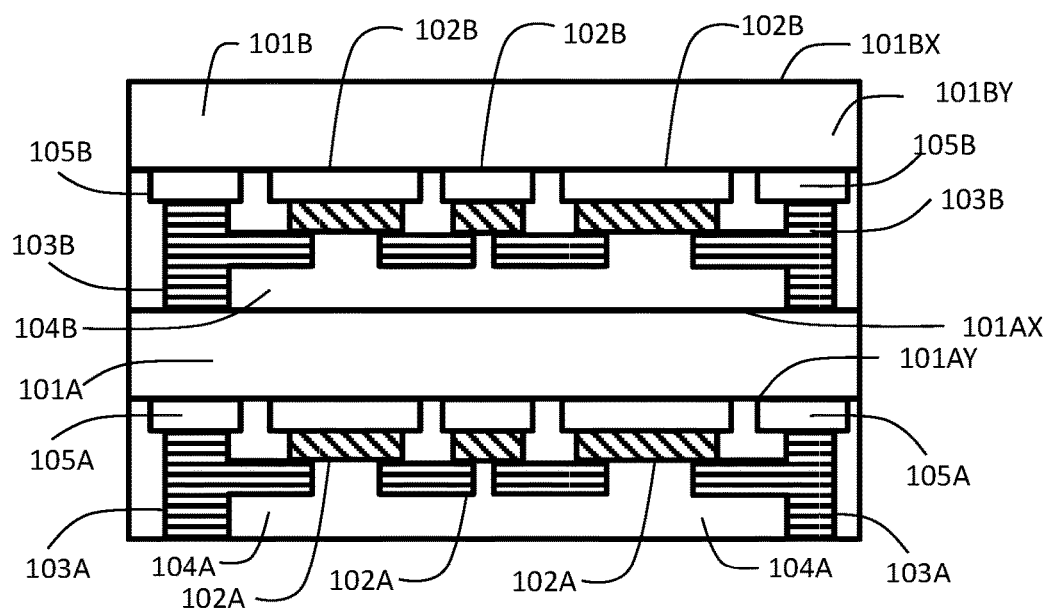
FIG. 9A to FIG. 9B illustrate a schematic cross-sectional view of a multiple-substrate three-dimensional package structure in accordance with the present invention.
Figure 9B:
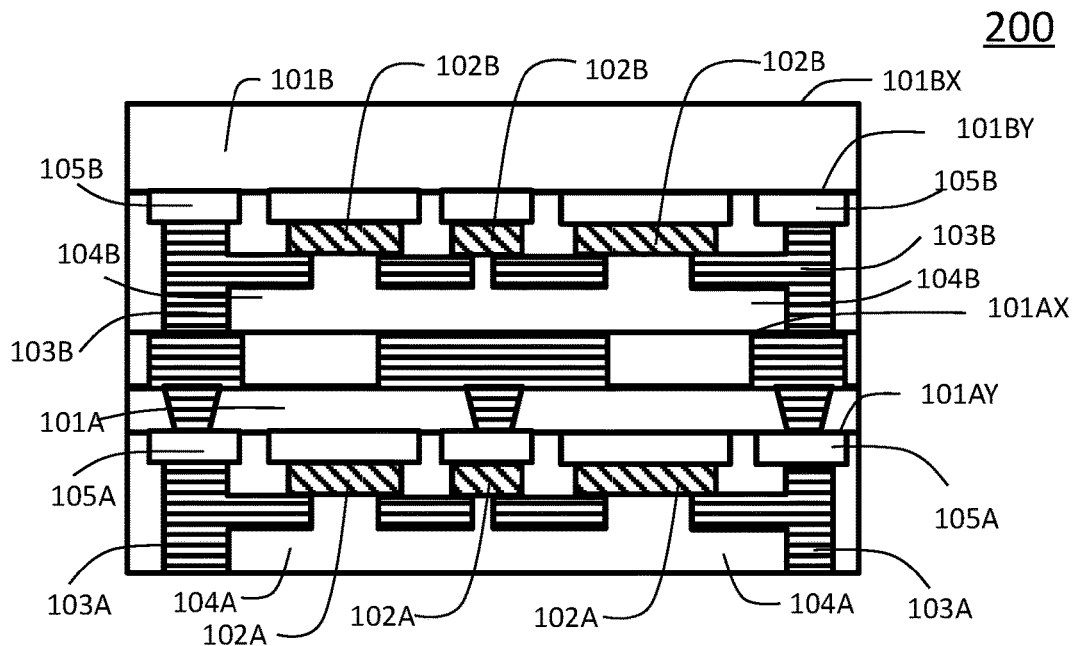

FIG. 9A to FIG. 9B illustrates a schematic cross-sectional view of a multiple-substrate three-dimensional package structure 200 in accordance with the present invention. Each of the first package structure and the second package structure can be a three-dimensional package structure 100 previously described. The multiple-substrate three-dimensional package structure 200 comprises a first substrate 101A, a first plurality of discrete conductive components 102A, a first plurality of conductive patterns 103A, a first encapsulating material 104A, a second substrate 101B, a second plurality of discrete conductive components 102B, a second plurality of conductive patterns 103B, a second encapsulating material 104B. The multiple-substrate three-dimensional package structure 200 comprises: a first substrate 101A having a first top surface 101AX and a first bottom surface 101AY; a first plurality of discrete conductive components 102A disposed over the first bottom surface 101AY of the first substrate 101A; a first plurality of conductive patterns 103A disposed over the first plurality of discrete conductive components 102A to electrically connect the first plurality of discrete conductive components 102A; a second substrate 101B having a second top surface 101BX and a second bottom surface 101BY; a second plurality of discrete conductive components 102B disposed over the second bottom surface 101BY of the second substrate 101B; and a second plurality of conductive patterns 103B disposed over the second plurality of discrete conductive components 102B to electrically connect the second plurality of discrete conductive components 102B; wherein the first plurality of conductive patterns 103A are electrically connected the second substrate 101B.

Figure 10:
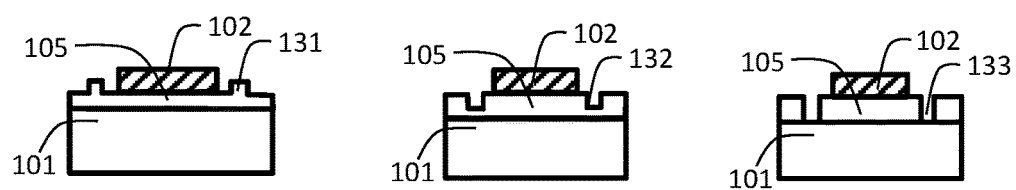
FIG. 10 illustrates a schematic cross-sectional view of the three-dimensional package structure where the surface of the bottom metallic sheet have a plurality of protrusions, recesses or through-holes in accordance with the present invention.

The surface of the bottom metallic sheet 105 can have a plurality of protrusions 131, recesses 132 or through-holes 133 not only to increase precision of the device configuration but also to increase surface area such that better adhesive force exists between the metallic sheet and the insulating material (See FIG. 10).

Figure 11:
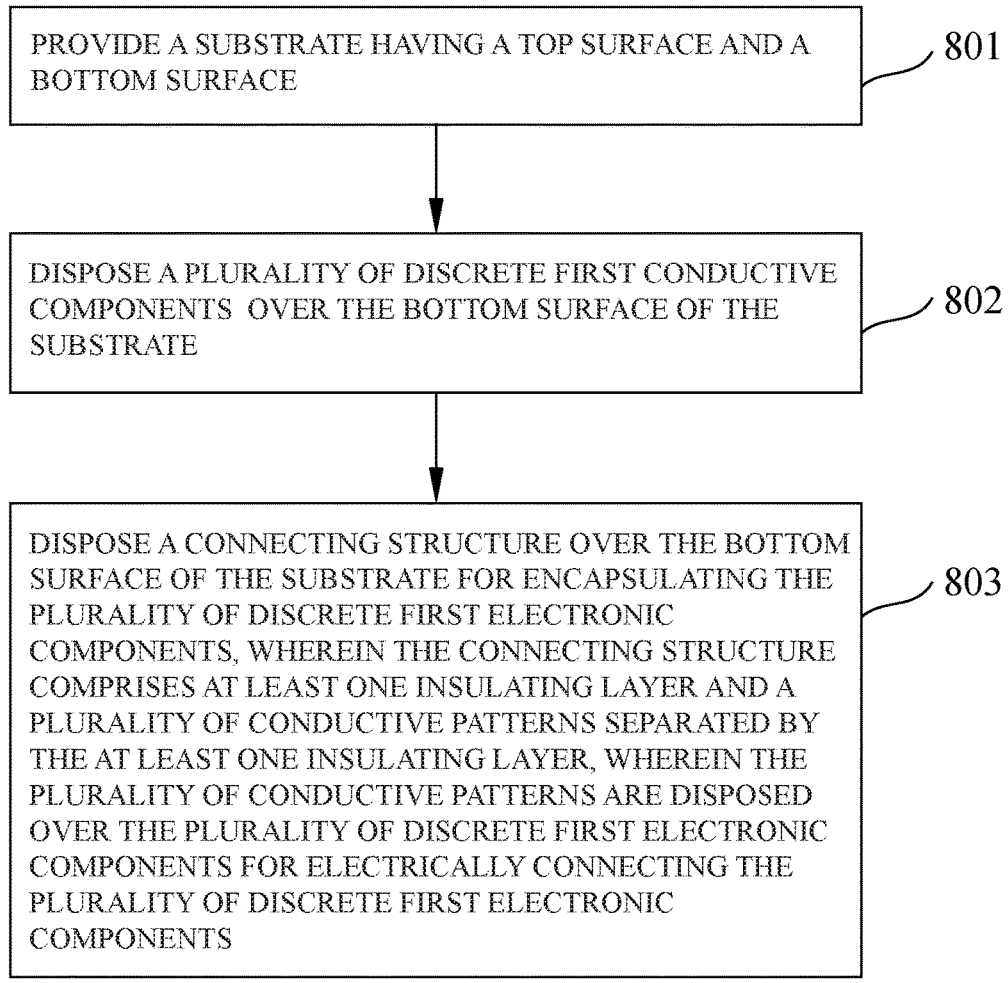
FIG. 11 is the process flow of manufacturing the three-dimensional package structure.

FIG. 11 is the process flow of manufacturing the three-dimensional package structure 100. In step 801, provide a substrate 101 having a top surface 101X and a bottom surface 101Y. In step 802, dispose a first plurality of discrete conductive components 102 over the bottom surface 101Y of the substrate 101. In step 803, dispose a connecting structure 103, 104 over the bottom surface 101Y of the substrate 101 for encapsulating the first plurality of discrete electronic components 102, wherein the connecting structure 103, 104 comprises at least one insulating layer 104 and a plurality of conductive patterns 103 separated by the at least one insulating layer 104, wherein the plurality of conductive patterns 103 are disposed over the first plurality of discrete electronic components 102 for electrically connecting the first plurality of discrete electronic components 102.

It follows from description of the above embodiments that the package structure in the present invention and the method for manufacturing the same can offer many advantages including: 1. compared to conventional circuit routing by using Al wire (longer wiring distance), wiring distance can be shortened to reduce the resistance and improve electrical efficiency (e.g., using Cu wire); 2. the strength and reliability for the connection of wire and components is superior to conventional soldering or wire bonding; 3. the height of the package structure can be further reduced; 4. circuit pattern is formed by lithography process so that it's suitable for mass production 5. the three-dimensional package structure has a double-surface dissipating function.

The above disclosure is related to the detailed technical contents and inventive features thereof. People skilled in the art may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A three-dimensional package structure, comprising:
a substrate, having a top surface and a bottom surface;
a first plurality of discrete electronic components, wherein the first plurality of discrete electronic components are laterally placed and disposed over the bottom surface of the substrate; and
a first insulating layer, disposed over the bottom surface of the substrate to encapsulate the first plurality of discrete electronic components, wherein the first insulating layer forms a substantially horizontal surface over the first plurality of discrete electronic components and extended from said substantially horizontal surface in a direction towards the substrate to fill a horizontal gap between the first plurality of discrete electronic components, wherein a plurality of conductive patterns are disposed over the bottom surface of the substrate, wherein a first discrete electronic component and a second discrete electronic component of the first plurality of discrete electronic components are electrically connected via a first conductive pattern that is disposed on and in contact with the substantially horizontal surface; and
at least one second insulating layer, disposed over the first insulating layer and the first conductive pattern, wherein a plurality of surface-mount pads are disposed on the bottom surface of the at least one second insulating layer and electrically connected to at least one via disposed in the at least one second insulating layer.

2. The three-dimensional package structure of claim 1, wherein terminals of the first plurality of discrete electronic components are disposed on the substantially horizontal surface.

3. The three-dimensional package structure according to claim 1, further comprising a second plurality of electronic components disposed aside the substrate, wherein the first insulating layer encapsulates the second plurality of discrete electronic components.

4. The three-dimensional package structure according to claim 1, wherein the substrate is a PCB.

5. The three-dimensional package structure according to claim 1, wherein the substrate is a heat-dissipating substrate.

6. The three-dimensional package structure according to claim 1, wherein the substrate is a lead frame.

7. The three-dimensional package structure according to claim 1, wherein the substrate is a metallic substrate.

8. The three-dimensional package structure according to claim 1, wherein the substrate is a unitary body made of an insulating and heat-conducting material.

9. The three-dimensional package structure according to claim 1, wherein the substrate is a unitary metallic sheet made of an electrically-conducting and heat-conducting material.

10. The three-dimensional package structure according to claim 1, wherein the substrate comprises a cavity therein, wherein at least one of the first plurality of discrete electronic components is disposed in the cavity.

11. The three-dimensional package structure according to claim 1, wherein the substrate comprises a carrier having a first surface and a second surface opposite to the first surface, wherein the first plurality of discrete electronic components are disposed over the first surface of the carrier; and wherein a metallic sheet is disposed on the second surface of the carrier.

12. The three-dimensional package structure according to claim 11, wherein the carrier has a plurality of via patterns connecting the top metallic sheet to the first plurality of discrete electronic components.

13. The three-dimensional package structure according to claim 1, further comprising a housing around the periphery of the substrate to expose a portion of the top surface of the substrate and a portion of the plurality of conductive patterns.

14. The three-dimensional package structure according to claim 1, further comprising a first heat-sink disposed over the top surface of the substrate.

15. The three-dimensional package structure according to claim 14, further comprising a second heat-sink disposed over the bottom surface of the at least one second insulating layer.

16. The three-dimensional package structure according to claim 15, further comprising a lead frame disposed between the at least one second insulating layer and the second heat-sink to form a SIP, or a DIP package structure.

17. The three-dimensional package structure according to claim 1, wherein a shielding layer is disposed in the at least one second insulating layer.

18. The three-dimensional package structure according to claim 1, wherein a metallic sheet is disposed on the substrate, wherein the first insulating layer is disposed on the metallic sheet and encapsulating the first plurality of discrete electronic components.

* * * * *